United States Patent
Lee et al.

(10) Patent No.: US 8,947,938 B2
(45) Date of Patent: Feb. 3, 2015

(54) TWO-TRANSISTOR NON-VOLATILE MEMORY CELL AND RELATED PROGRAM AND READ METHODS

(71) Applicant: Taiwan Semiconductor Manufacturing Company, Ltd., Hsin-Chu (TW)

(72) Inventors: Te-Liang Lee, Hsin-Chu (TW); Chin-Yuan Ko, Hsin-Chu (TW); Ming-Yih Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 257 days.

(21) Appl. No.: 13/624,291

(22) Filed: Sep. 21, 2012

(65) Prior Publication Data

US 2014/0085984 A1    Mar. 27, 2014

(51) Int. Cl.
*G11C 16/04*        (2006.01)
*G11C 16/06*        (2006.01)

(52) U.S. Cl.
USPC ............ 365/185.18; 365/185.14; 365/185.24; 257/315

(58) Field of Classification Search
USPC ............ 365/185.14, 185.18, 185.24; 257/315
See application file for complete search history.

(56) References Cited

U.S. PATENT DOCUMENTS

| | | | |
|---|---|---|---|
| 5,604,700 A | 2/1997 | Parris et al. | |
| 5,719,427 A * | 2/1998 | Tong et al. | 257/355 |
| 6,222,764 B1 * | 4/2001 | Kelley et al. | 365/185.07 |
| 6,404,006 B2 * | 6/2002 | Li et al. | 257/321 |
| 6,950,342 B2 | 9/2005 | Lindhorst et al. | |
| 7,339,829 B2 | 3/2008 | Sarig | |
| 7,679,119 B2 | 3/2010 | Roizin et al. | |
| 7,700,994 B2 | 4/2010 | Roizin | |
| 8,064,274 B2 * | 11/2011 | Fisch et al. | 365/189.09 |
| 2011/0216596 A1 * | 9/2011 | Choi | 365/185.18 |

FOREIGN PATENT DOCUMENTS

EP    0623959 A2    11/1994
JP    09185891 A    7/1997

* cited by examiner

*Primary Examiner* — Tha-O H Bui
(74) *Attorney, Agent, or Firm* — Slater & Matsil, L.L.P.

(57) ABSTRACT

A memory device includes an N-channel transistor and a P-channel transistor. A word line is electrically connected to a drain terminal of the N-channel transistor, and a source terminal of the P-channel transistor. A first bit line is electrically connected to a source terminal of the N-channel transistor. A second bit line is electrically connected to a drain terminal of the P-channel transistor. Gate terminals of the N-channel transistor and the P-channel transistor are electrically connected and floating.

20 Claims, 14 Drawing Sheets

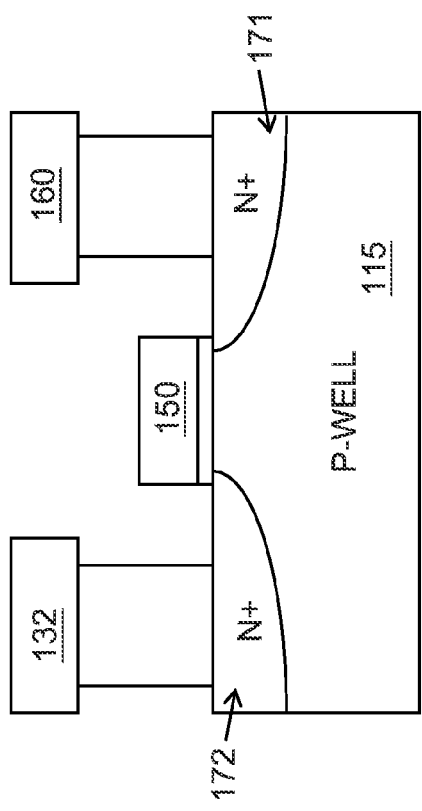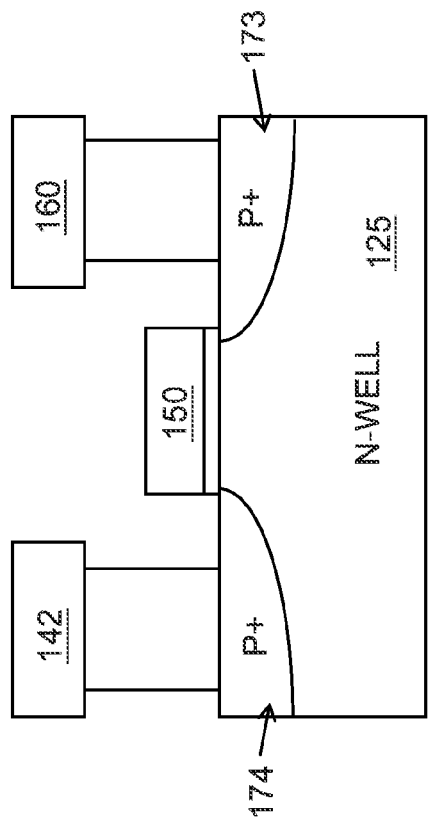
Figure 3
Figure 4

TWO-TRANSISTOR NON-VOLATILE MEMORY CELL AND RELATED PROGRAM AND READ METHODS

BACKGROUND

Non-volatile memory (NVM) is used in various devices, such as computers. NVM is a type of memory storage that can retain data even while it is not powered on. NVM may be electrically addressed or mechanically addressed. Examples of electrically addressed NVM include flash memory, EPROMs, and EEPROMs. NVM may also be one-time programmable (OTP) or multiple-times programmable (MTP). NVM being "logic-compatible" indicates that the NVM can be manufactured using an existing logic semiconductor process, without adding special steps or materials.

With scaling down of critical dimension (CD) in semiconductor processes, NVM performance becomes harder to achieve, particularly in areas of design complexity, cycle time, cost, retention, and operating margins (read, write, erase). There is a need for an NVM device that scales down well, while maintaining high performance in the above areas.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 3 is a cross sectional view of the memory cell taken along section line 3-3 of FIG. 2;

FIG. 4 is a cross sectional view of the memory cell taken along section line 4-4 of FIG. 2;

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a non-volatile memory (NVM) device and the like. Other embodiments may also be applied, however, to other devices which provide memory storage.

Throughout the various figures and discussion, like reference numbers refer to like components. Also, although singular components may be depicted throughout some of the figures, this is for simplicity of illustration and ease of discussion. A person having ordinary skill in the art will readily appreciate that such discussion and depiction can be and usually is applicable for many components within a structure.

A novel two-transistor (2T) non-volatile memory (NVM) cell in accordance with various embodiments is described. The 2T NVM cell can be programmed through channel hot electron injection (CHEI) and/or channel hot hole induced hot electron (CHHIHE), and erased through band-to-band hot hole (BBHH) injection and/or Fowler-Nordheim (FN) electron ejection. A differential read scheme may be used to shrink dimensions of the 2T NVM cell. The 2T NVM cell includes an N-channel transistor and a P-channel transistor that share a floating gate. The N-channel and P-channel transistor may be metal-oxide-semiconductor field effect transistors (MOSFETs), including standard MOSFETs, high voltage MOSFETs, core MOSFETs, and/or input/output (I/O) MOSFETs.

Figure 1:
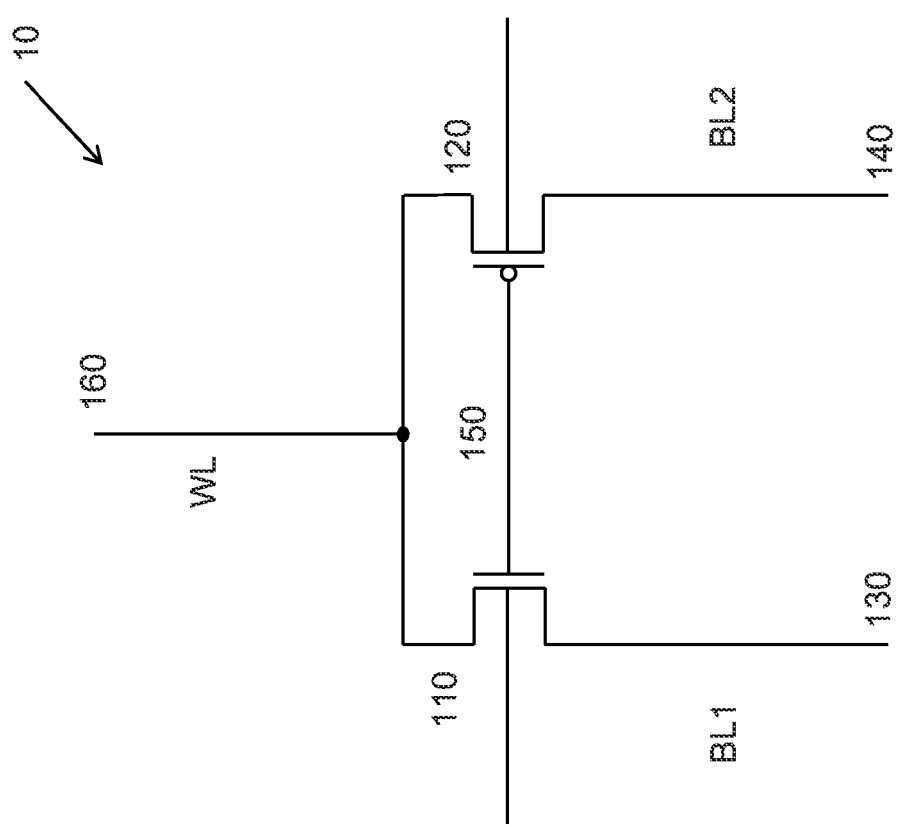
FIG. 1 is a circuit diagram of a memory cell according to some embodiments of the present disclosure.
Figure 2:
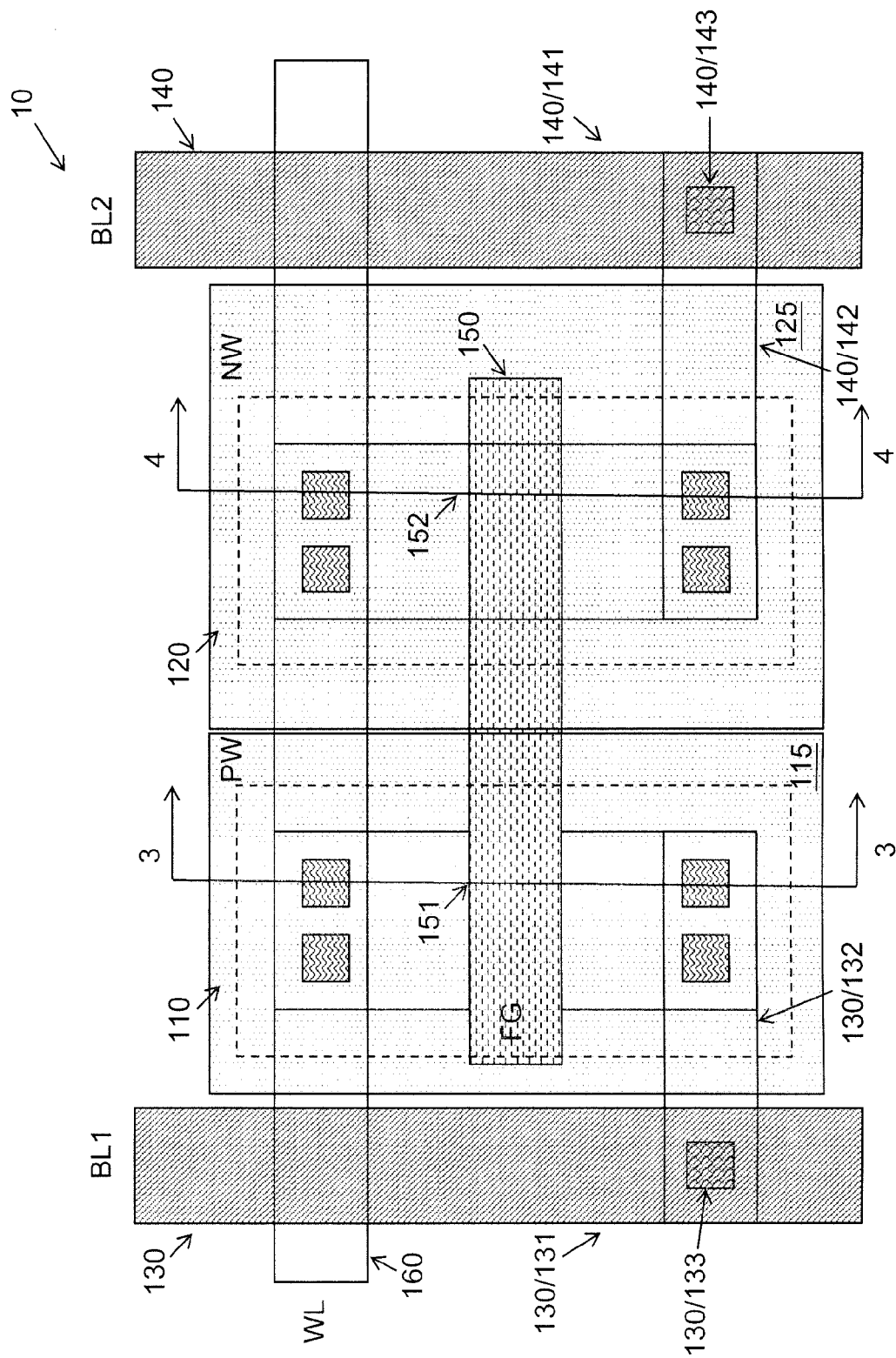
FIG. 2 is a top layout view of the memory cell in accordance with various embodiments of the present disclosure.
Figure 5:
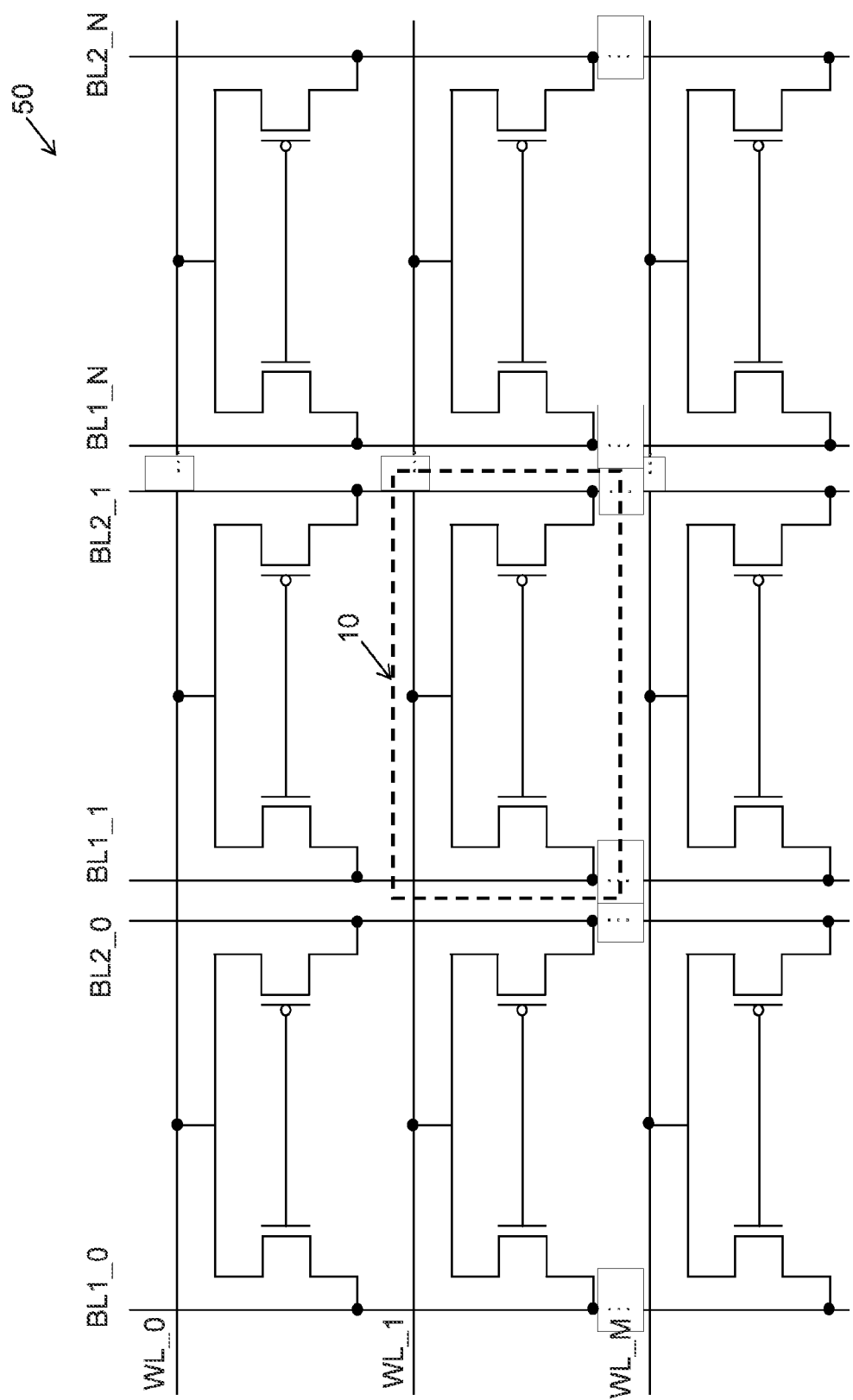
FIG. 5 is a circuit diagram of an array of memory cells in accordance with various embodiments of the present disclosure.

FIG. 1 illustrates a memory cell 10 including an N-channel transistor 110 and a P-channel transistor 120 in accordance with various embodiments of the present disclosure. Layout views of the memory cell 10 are shown in FIGS. 2-4. A circuit diagram of a memory array 50 of memory cells the same as the memory cell 10 is shown in FIG. 5. In general, the memory array 50 may be an M×N array, where M and N are both positive integers, and may be the same or different, e.g. a 1024×1024 array.

The N-channel transistor 110 and the P-channel transistor 120 are formed in and on a substrate, and share a floating gate (FG) structure 150. In some embodiments, the substrate can include an elementary semiconductor including silicon or germanium in crystal, polycrystalline, or an amorphous structure; a compound semiconductor including silicon carbide, gallium arsenide, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof.

The N-channel transistor 110 may be an N-channel metal-oxide-semiconductor (NMOS) transistor, for example. The N-channel transistor 110 includes N-type source and drain regions (terminals, electrodes) that are separated by a channel region and formed in a P-type well (PW) 115. The P-type well 115 may simply be a P-type substrate in some embodiments. A first portion 151 (shown in FIG. 2) of the floating gate structure 150 extends over the channel region between the source and drain regions of the N-channel transistor 110. The floating gate structure 150 may be a polysilicon gate formed over a gate dielectric, such as silicon oxide, for example. The source and drain regions may be N+ regions formed in the substrate by appropriate implantation or diffusion of, for example, group V elements, such as phosphorus, arsenic, antimony, or the like, into the substrate.

The P-channel transistor 120 may be a P-channel metal-oxide-semiconductor (PMOS) transistor, for example. The P-channel transistor 120 includes P-type source and drain regions (terminals, electrodes) that are separated by a channel region and formed in an N-type well (NW) 125. The P-type source and drain regions may be P+ regions formed in the N-type well 125 by appropriate implantation or diffusion of, for example, group III elements, such as boron, aluminum, or the like, into the N-type well 125. A second portion 152 (shown in FIG. 2) of the floating gate structure 150 extends over the channel region between the source and drain regions of the P-channel transistor 120. The second portion 152 and the first portion 151 of the floating gate structure 150 may be monolithic, or may be physically separated portions electrically connected by an interconnect structure, such as a metal line.

The memory cell 10 can be considered a two-transistor (2T) memory cell. It has been determined through experimentation that previous 2T memory cells using single-ended read encounter implementation difficulty at reduced critical dimension. Typical 2T memory cells may be implemented using a minimum floating gate oxide (Gox) thickness ranging from about 70 Angstrom to about 85 Angstrom. A novel interconnection scheme is used in the memory cell 10 to allow gate oxide thickness down to about 50 Angstrom for the 2T memory cell. In particular, a drain terminal of the N-channel transistor 110 and a source terminal of the P-channel transistor 120 are both electrically connected to a word line (WL) 160. A source terminal of the N-channel transistor 110 is electrically connected to a first bit line (BL1) 130, and a drain terminal of the P-channel transistor 120 is electrically connected to a second bit line (BL2) 140. It is noted that source and drain regions in metal-oxide-semiconductor field effect transistors (MOSFETs) are generally interchangeable.

FIGS. 3 and 4 are cross-sectional views showing portions of the memory cell 10 taken along section lines 3-3 and 4-4 of FIG. 2, respectively. The memory cell 10 layout shown in FIGS. 2-4 is only one of many possible layouts. The N-channel transistor 110 is formed in a P-type region, such as a P-type semiconductor substrate or a P-type well region in a semiconductor substrate. The P-channel transistor 120 is formed in an N-type well region formed in the P-type well region or P-type semiconductor substrate. The floating gate 150 may be a polysilicon gate, and extends through source and drain regions of both the N-channel transistor 110 and the P-channel transistor 120. The drain 171 (see FIG. 3) of the N-channel transistor 110 and the source 173 (see FIG. 4) of the P-channel transistor 120 are electrically connected to the word line 160, which may be formed in a first metal (M1) layer, for example, in a back-end-of-line (BEOL) process. The source 172 (see FIG. 3) of the N-channel transistor 110 is electrically connected to the first bit line 130, which may include a second metal (M2) line 131, an M1 line 132, and an M2-M1 contact via 133. The drain 174 (see FIG. 4) of the P-channel transistor 120 is electrically connected to the second bit line 140, which may include a second metal (M2) line 141, an M1 line 142, and an M2–M1 contact via 143. The first and second bit lines 130, 140 may have portions 131, 141 substantially perpendicular to the word line 160. Embodiments using different metal layers to realize the word line 160, the first bit line 130, and the second bit line 140 are contemplated. Accordingly, a non-volatile memory device is provided that exhibits the benefits described above with respect to thin gate oxide thickness, e.g. about 50 Angstrom.

The memory cell 10 may be programmed by channel hot electron injection (CHEI) and/or channel hot hole induced hot electron (CHHIHE), erased by band-to-band hot hole (BBHH) injection and/or Fowler-Nordheim (FN) electron ejection, and read differentially. To facilitate these operations, in the memory cell 10, the word line 160 is electrically connected to a voltage source (not shown) to receive a word line signal VWL. The first bit line 130 is electrically connected to a voltage source (not shown) to receive a first bit line signal VBL1. The second bit line 140 is electrically connected to a voltage source (not shown) to receive a second bit line signal VBL2. The N-type well 125 is electrically connected to a voltage source (not shown) for being biased by an N-Well bias signal VNW. The P-type well 115 may be electrically connected to a voltage source (not shown) for being biased by a P-Well bias signal VPW.

In the following, the floating gate 150 is considered to be "programmed" when it stores a net negative charge, and is considered to be "erased" when it stores a net positive charge. In particular, the floating gate 150 is programmed when it stores a negative charge that is sufficient to turn on the P-channel transistor 120 and keep the N-channel transistor 110 turned off when a read voltage is applied to the memory cell 10 through the word line 160. The floating gate 150 is erased when it stores a positive charge that is sufficient to turn on the N-channel transistor 110 and keep the P-channel transistor 120 turned off when a read voltage is applied to the memory cell 10 through the word line 160.

By using the word line 160, the first and second bit lines 130, 140, and the N-type well 125 and P-type well 115 to control operation of the N-channel transistor 110 and the P-channel transistor 120, the memory cell 10 is programmed by hot carrier injection (HCI), such as CHEI, and erased by band-to-band hot hole (BBHH) injection, as will be explained below.

Figure 6:
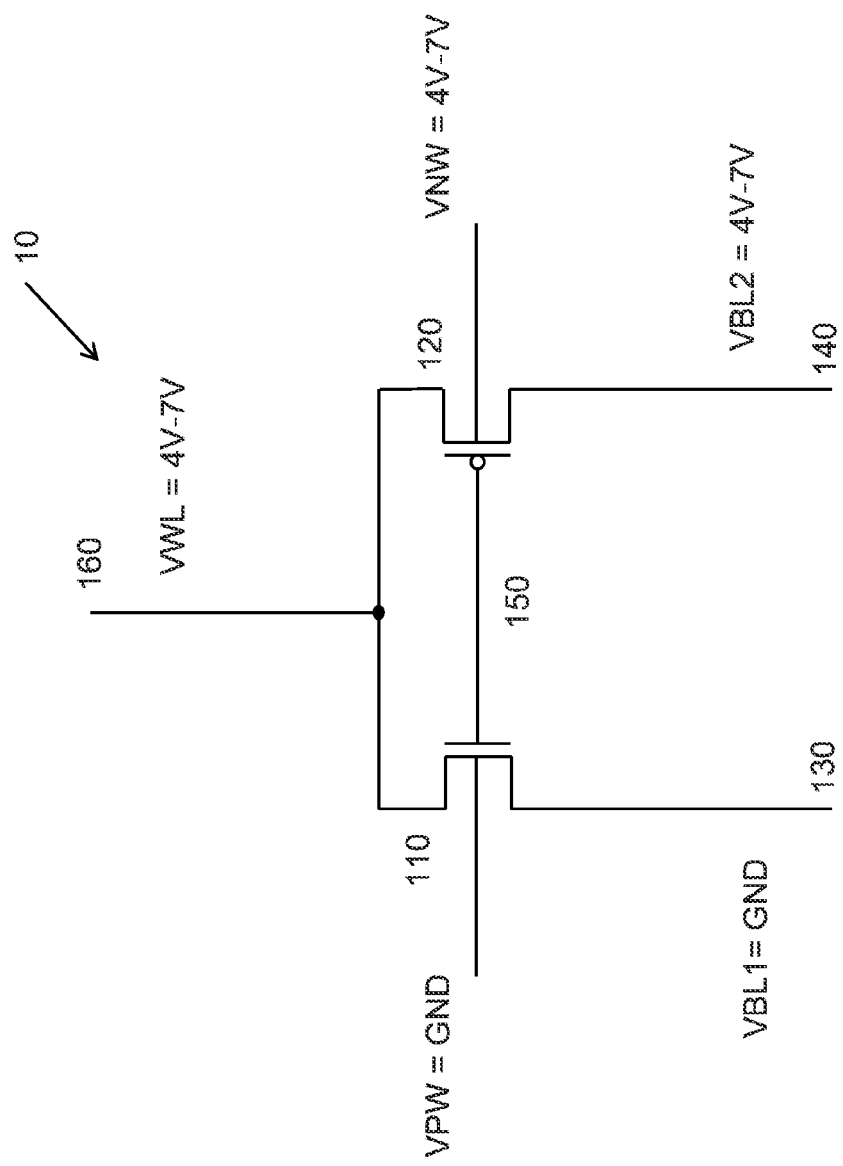
FIG. 6 is a diagram of a program operation in accordance with various embodiments of the present disclosure.

The memory cell 10 is programmable by various program operations, one of which is shown in FIG. 6. During the program operation shown in FIG. 6, a programming voltage in a range of about 4 Volts to about 7 Volts is applied through the word line 160 to both the drain terminal of the N-channel transistor 110 and the source terminal of the P-channel transistor 120. The source terminal of the N-channel transistor 110 is grounded, and the drain terminal of the P-channel transistor 120 may be 4V-7V, for example. Under these voltage conditions, the source, drain, and well terminals of the P-channel transistor 120 are all biased at the programming voltage, such that the P-channel transistor 120 and the floating gate 150 act similarly to a stacked gate of the N-channel transistor 110, with the programming voltage coupled to the floating gate 150. Thus, electron-hole pairs are generated in the drain region of the N-channel transistor 110. The electrons are accelerated by a lateral electric field toward the channel region of the N-channel transistor 110, and some of the electrons attain sufficient energy to be injected into the floating gate 150 in what is known as hot carrier injection (or channel hot electron injection, CHEI). As described, the programming voltage may be in a range of about 4 Volts to about 7 Volts (higher than a hot channel injection programming threshold), for example, but it is understood that as critical dimensions and gate oxide thickness decrease, programming voltage required to achieve a similar hot carrier injection effect as described above may decrease. In some embodiments, a range of about 5.5 Volts to about 6.5 Volts may be used for the programming voltage.

Figure 7:
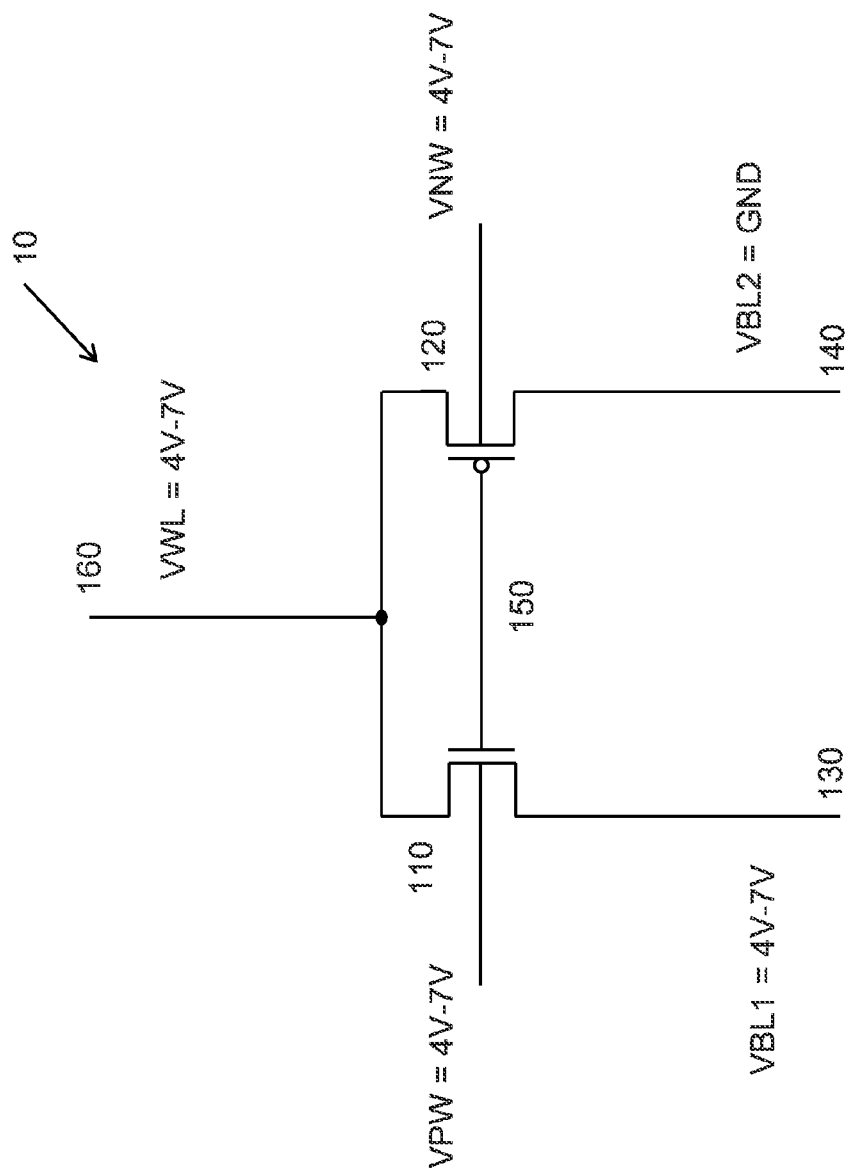
FIG. 7 is a diagram of a program operation in accordance with various embodiments of the present disclosure.

A program operation according to various embodiments is shown in FIG. 7. The program operation shown in FIG. 7 is similar to that shown in FIG. 6, except that the ground node is the drain terminal of the P-channel transistor 120. As shown in FIG. 7, under these voltage conditions, electron-hole pairs are generated by channel hot hole induced hot electron (CHHIHE) in the drain region of the P-channel transistor 120, and electrons are able to attain sufficient energy to be injected into the floating gate 150. The programming voltage may be in a range of about 4 Volts to about 7 Volts (higher than a hot channel injection programming threshold), but it is understood that as critical dimensions and gate oxide thickness decrease, programming voltage required to achieve a similar hot carrier injection effect as described above may decrease. In some embodiments, a range of about 5.5 Volts to about 6.5 Volts may be used for the programming voltage.

Figure 8:
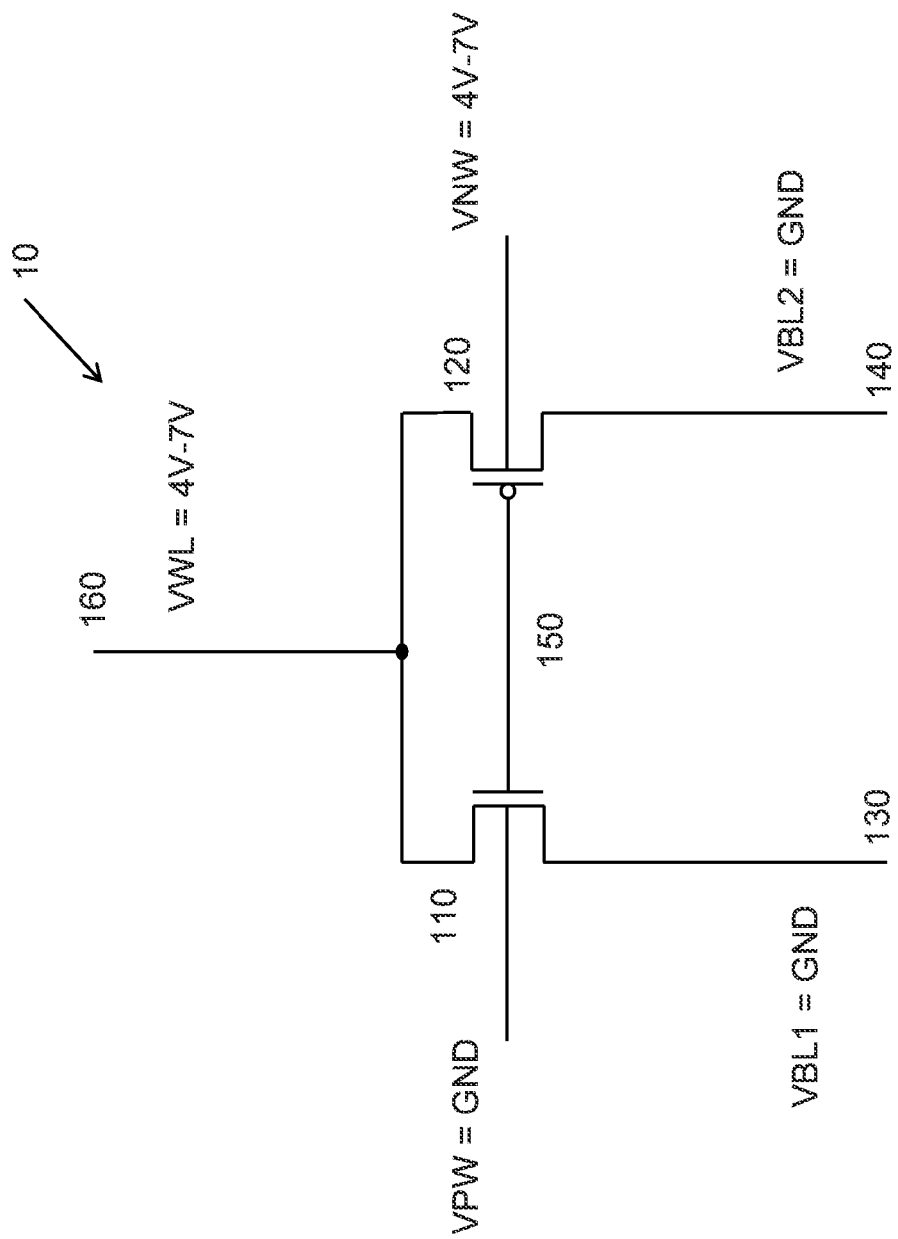
FIG. 8 is a diagram of a program operation in accordance with various embodiments of the present disclosure.

A program operation according to various embodiments is shown in FIG. 8. The program operation shown in FIG. 8 is similar to that shown in FIG. 6, except that both the source terminal of the N-channel transistor 110 and the drain terminal of the P-channel transistor 120 are grounded. As shown in FIG. 8, under these voltage conditions, electrons are able to attain sufficient energy to be injected into the floating gate 150. The programming voltage may be in a range of about 4 Volts to about 7 Volts (higher than a hot channel injection programming threshold), but it is understood that as critical dimensions and gate oxide thickness decrease, programming voltage required to achieve a similar hot carrier injection effect as described above may decrease. In some embodiments, a range of about 5.5 Volts to about 6.5 Volts may be used for the programming voltage.

Figure 9:
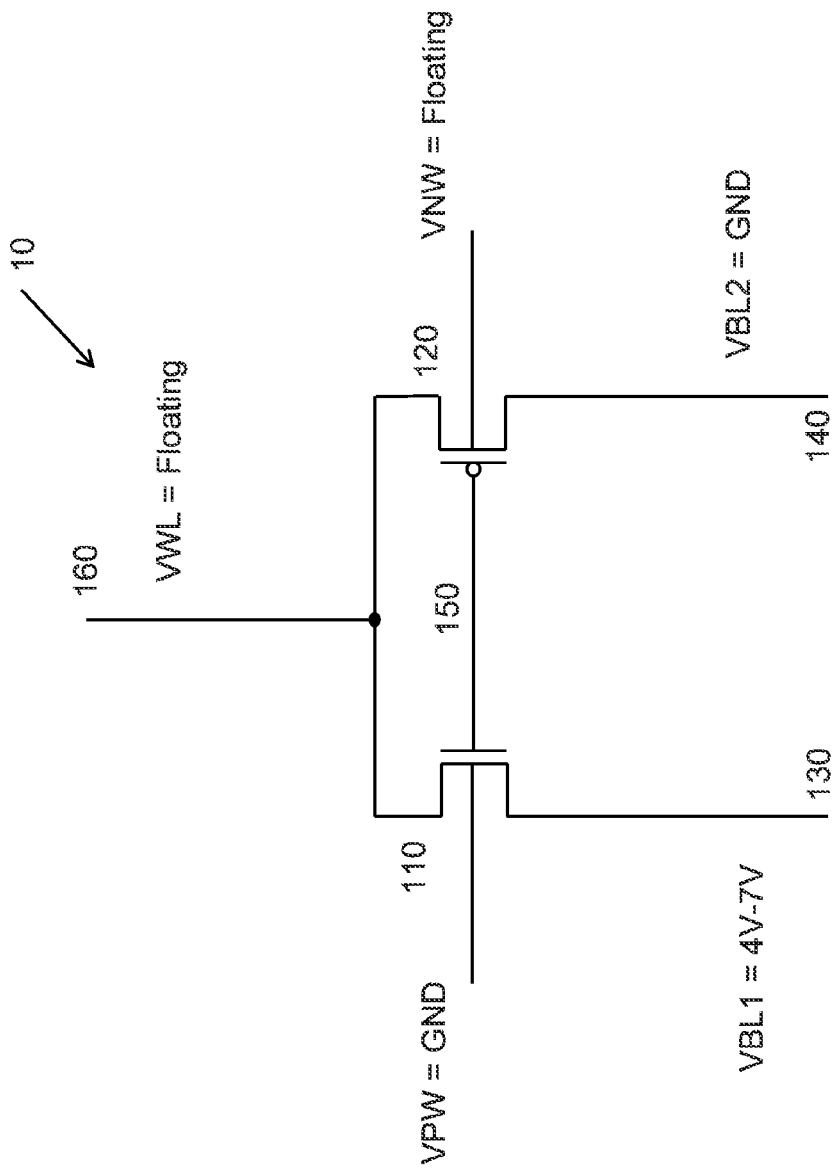
FIG. 9 is a diagram of an erase operation in accordance with various embodiments of the present disclosure.

An erase operation according to various embodiments is shown in FIG. 9. Initially, the floating gate 150 may be programmed, such that a net excess of electrons is present in the floating gate 150 to turn on the P-channel transistor 120 in the presence of a read voltage on the word line 160. During the erase operation, an erase voltage of about 4V to 7V is applied through the first bit line 130 to the source terminal of the N-channel transistor 110, the drain terminal of the P-channel transistor 120 is grounded, and the drain terminal of the N-channel transistor 110 and the source terminal of the P-channel transistor 120 are floating. The well terminal of the N-channel transistor 110 is grounded, which sets up reverse biasing between the N+ source of the N-channel transistor 110 and the P-well (or P-substrate). As shown in FIG. 9, under these voltage conditions, electron-hole pairs are generated in the source region of the N-channel transistor 110. The holes are accelerated by a lateral electric field toward the channel region of the N-channel transistor 110, and some of the holes attain sufficient energy to be injected into the floating gate 150 in a process known as band-to-band hot hole (BBHH) injection. As the holes accumulate in the floating gate 150, a net positive charge builds, which will act to turn on the N-channel transistor 110 and turn off the P-channel transistor 120 when a read voltage is applied to the word line 160. The source terminal of the P-channel transistor 120 may be grounded, which aids in attracting hot holes to be injected into the floating gate 150. By injecting more holes into the floating gate 150, read margin can be improved in the memory cell 10. As described, the erase voltage may be in a range of about 4 Volts to about 7 Volts, but it is understood that as critical dimensions and gate oxide thickness decrease, erase voltage required to achieve a similar BBHH injection effect as described above may decrease. In some embodiments, a range of about 5.5 Volts to about 6.5 Volts may be used for the programming voltage.

Figure 10:
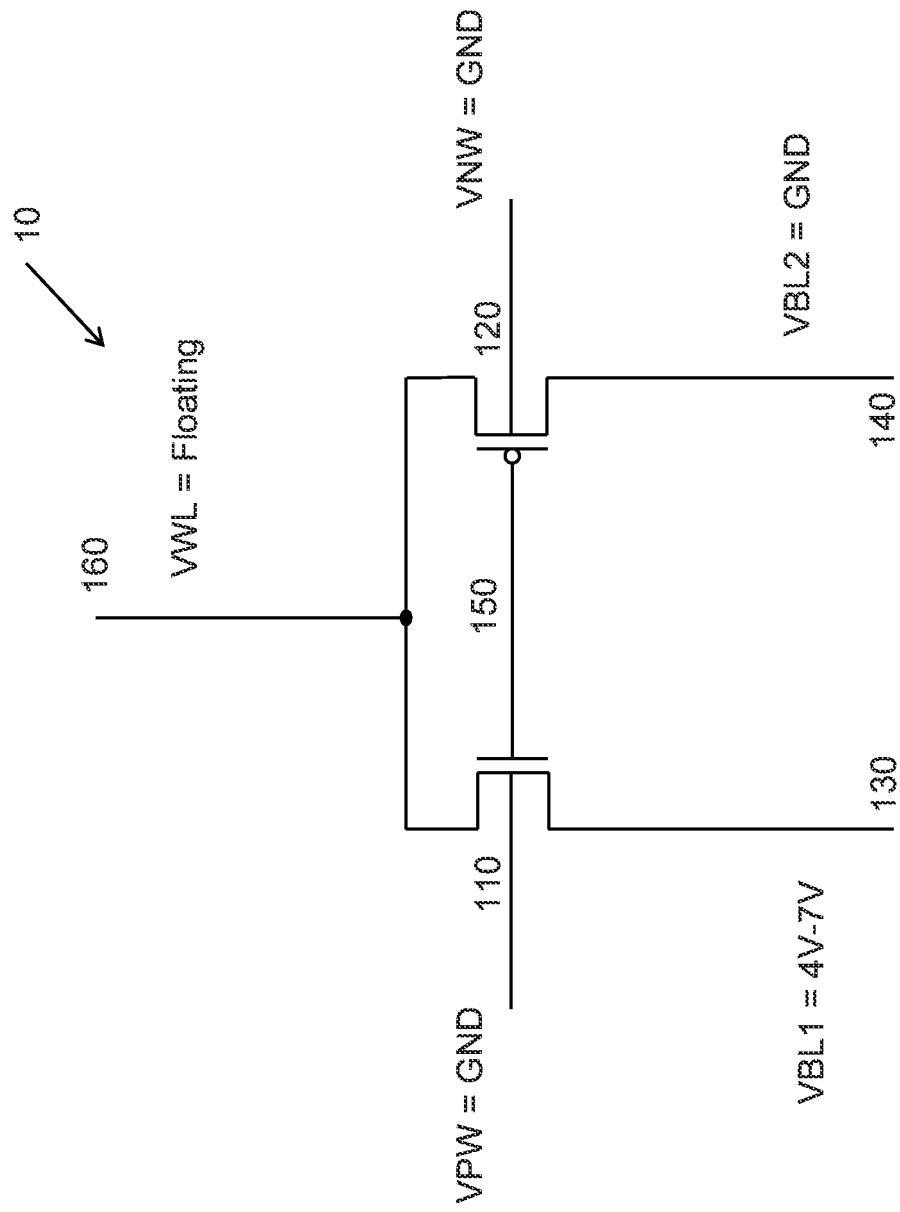
FIG. 10 is a diagram of an erase operation in accordance with various embodiments of the present disclosure.

An erase operation according to various embodiments is shown in FIG. 10. The erase operation shown in FIG. 10 is similar to that shown in FIG. 9, except that the N-well terminal of the P-channel transistor 120 is grounded. As shown in FIG. 10, under these voltage conditions, holes are able to attain sufficient energy to be injected into the floating gate 150. The erase voltage may be in a range of about 4 Volts to about 7 Volts, but it is understood that as critical dimensions and gate oxide thickness decrease, erase voltage required to achieve a similar BBHH injection effect as described above may decrease. In some embodiments, a range of about 5.5 Volts to about 6.5 Volts may be used for the programming voltage.

Figure 11:
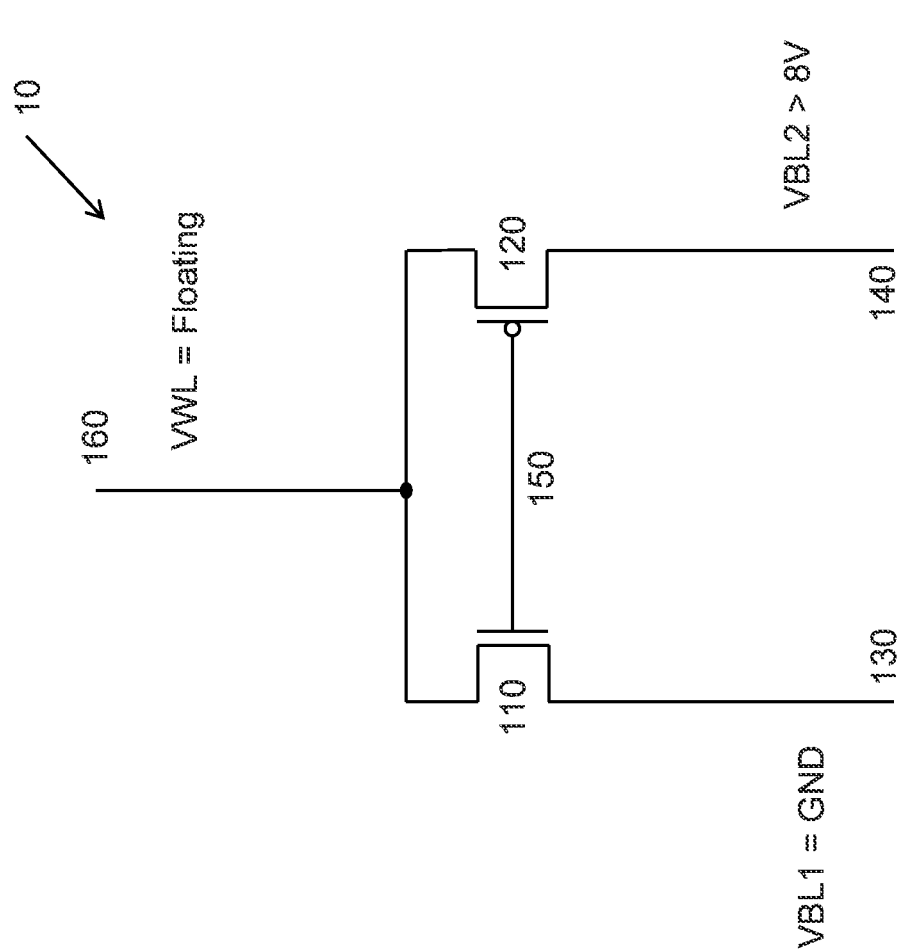
FIG. 11 is a diagram of an erase operation in accordance with various embodiments of the present disclosure.

An erase operation according to various embodiments is shown in FIG. 11. During the erase operation, an erase voltage of greater than about 8V is applied through the second bit line 140 to the drain terminal of the P-channel transistor 120, the source terminal of the P-channel transistor 120 and the drain terminal of the N-channel transistor 110 are floating, and the source terminal of the N-channel transistor 110 is grounded. Under these voltage conditions, Fowler-Nordheim tunneling can occur to erase the floating gate 150 by removing electrons from the floating gate 150.

Figure 12:
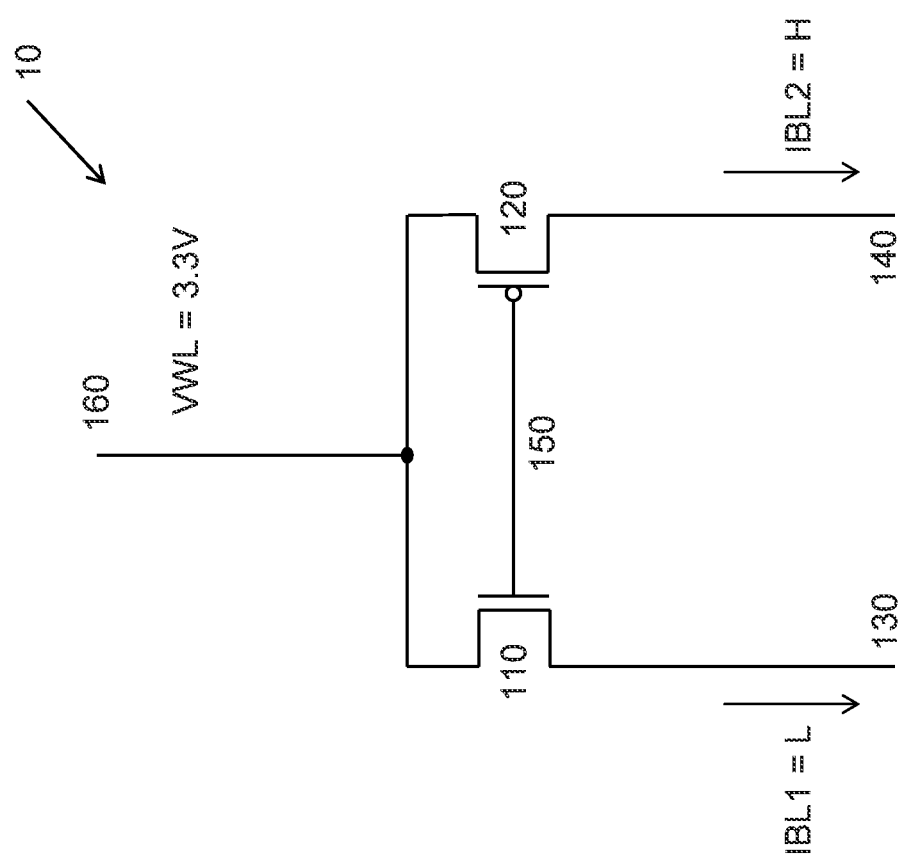
FIGS. 12 and 13 are diagrams of a read operation in accordance with various embodiments of the present disclosure.
Figure 13:
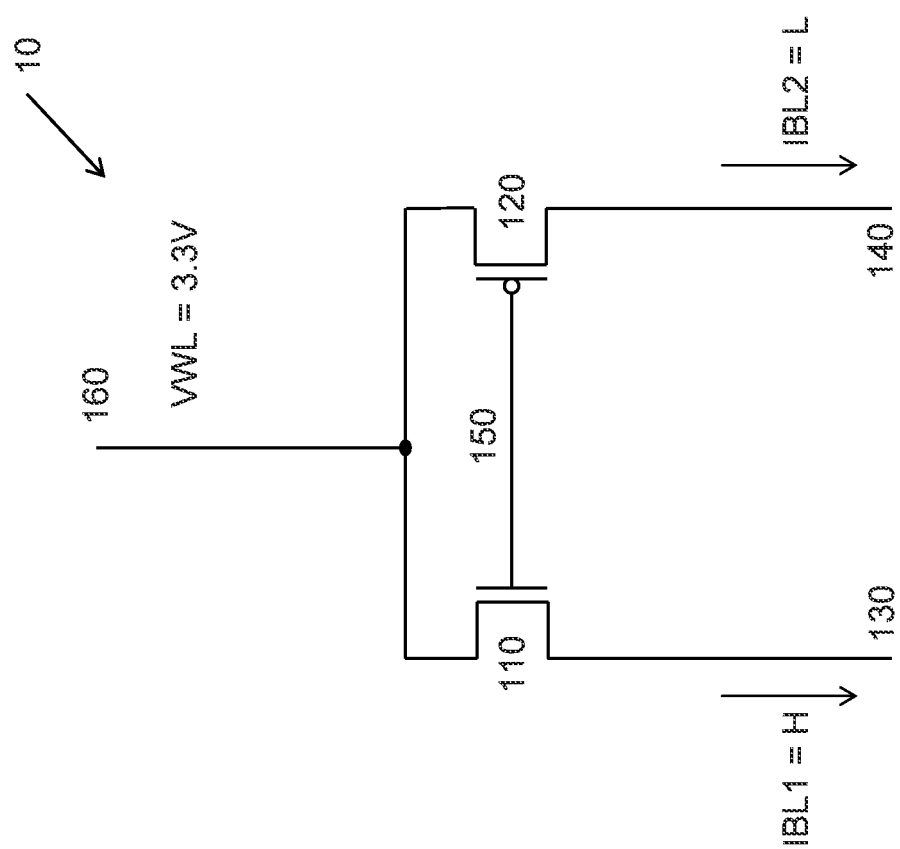

Read operations according to various embodiments are shown in FIG. 12 and FIG. 13. When the memory cell 10 is programmed, net negative charge is trapped in the floating gate 150, so that when a read voltage, e.g. 3.3 Volts, is applied through the word line 160 to the drain of the N-channel transistor 110 and the source terminal of the P-channel transistor 120, the P-channel transistor 120 is turned on, and the N-channel transistor 110 is turned off (shown in FIG. 12). Thus, first bit line current IBL1 flowing through the N-channel transistor 110 is low, while second bit line current IBL2 flowing through the P-channel transistor 120 is high. The first and second bit line currents IBL1, IBL2 can be sensed individually or differentially. To sense individually, the first bit line current IBL1 may be sensed while the second bit line 140 is floated, and the second bit line current IBL2 may be sensed while the first bit line 130 is floated. By using a differential read scheme, the memory cell 10 can be scaled down to 50 Angstrom gate oxide thickness or lower, and use a read voltage of about 2.5 Volts or less.

Referring to FIG. 13, when the memory cell 10 is erased, net positive charge is trapped in the floating gate 150, so that when the read voltage, e.g. 3.3 Volts, is applied through the word line 160 to the drain of the N-channel transistor 110 and the source terminal of the P-channel transistor 120, turning on the N-channel transistor 110, and turning off the P-channel transistor 120. Thus, first bit line current IBL1 flowing through the N-channel transistor 110 is high, while second bit line current IBL2 flowing through the P-channel transistor 120 is low. The first and second bit line currents IBL1, IBL2 can be sensed individually or differentially. To sense individually, the first bit line current IBL1 may be sensed while the second bit line 140 is floated, and the second bit line current IBL2 may be sensed while the first bit line 130 is floated. By using a differential read scheme, the memory cell 10 can be scaled down to 50 Angstrom gate oxide thickness or lower, and use a read voltage of about 2.5 Volts or less.

Table 1 summarizes operation voltages of the memory cell 10 for program, erase, and read modes in accordance with various embodiments of the present disclosure.

TABLE 1

|  |  | VWL | VBL1 | VPW | VBL2 | VNW |
|---|---|---|---|---|---|---|
| Program | 1 | 4 V-7 V | GND | GND | 4 V-7 V | 4 V-7 V |
|  | 2 | 4 V-7 V | 4 V-7 V | 4 V-7 V | GND | 4 V-7 V |
|  | 3 | 4 V-7 V | GND | GND | GND | 4 V-7 V |
| Erase | 1 | Floating | 4 V-7 V | GND | GND | Floating |
|  | 2 | Floating | 4 V-7 V | GND | GND | GND |
|  | 3 | Floating | GND | GND | >8 V | Floating |
| Read | 1 | 3.3 V | GND | GND | GND | 3.3 V |
|  | 2 | 3.3 V | GND | GND | Floating | 3.3 V |
|  | 3 | 3.3 V | Floating | GND | GND | 3.3 V |

Figure 14:
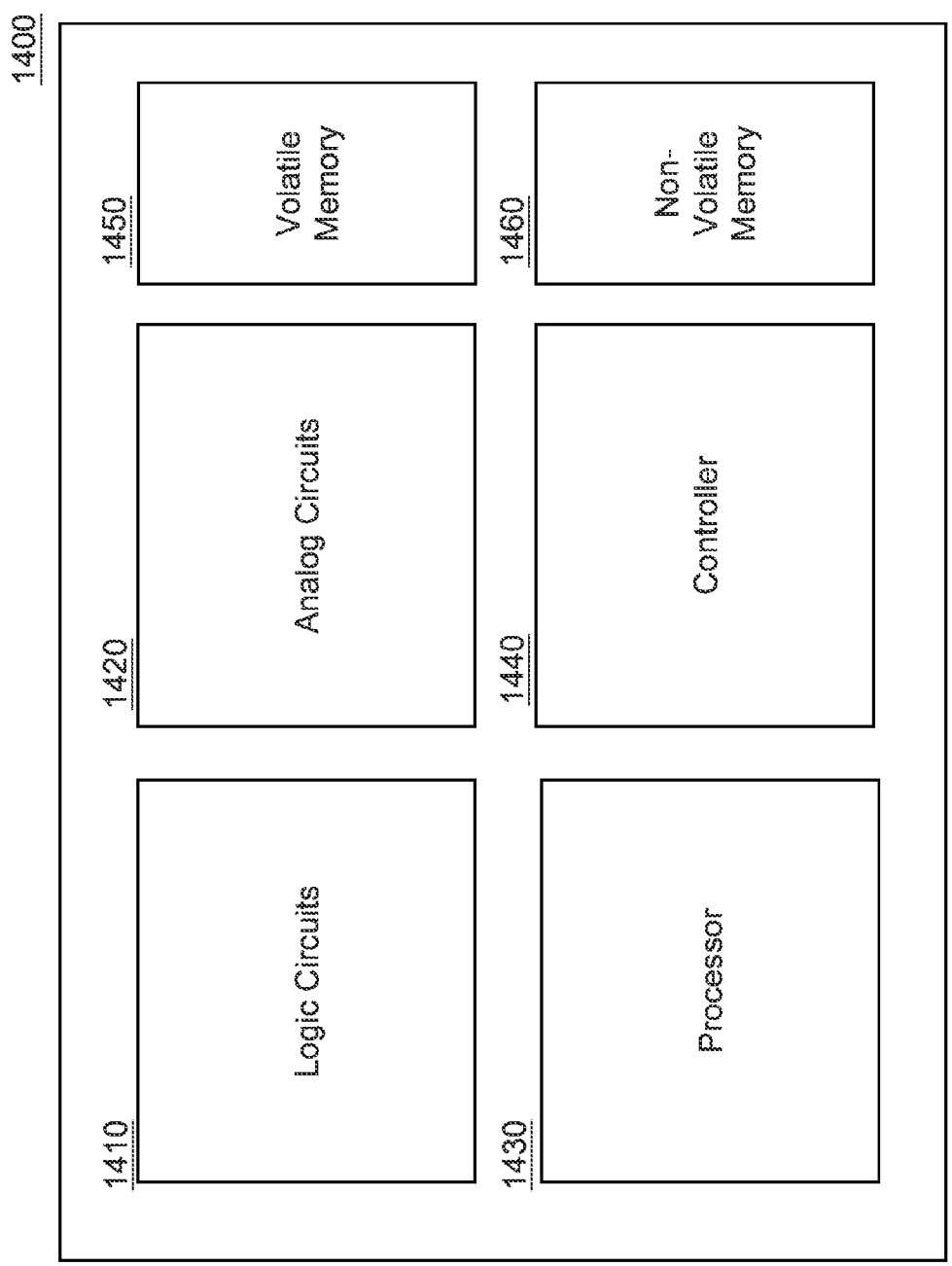
FIG. 14 is a block diagram of an integrated circuit die that uses the memory cell.
Figure 15:
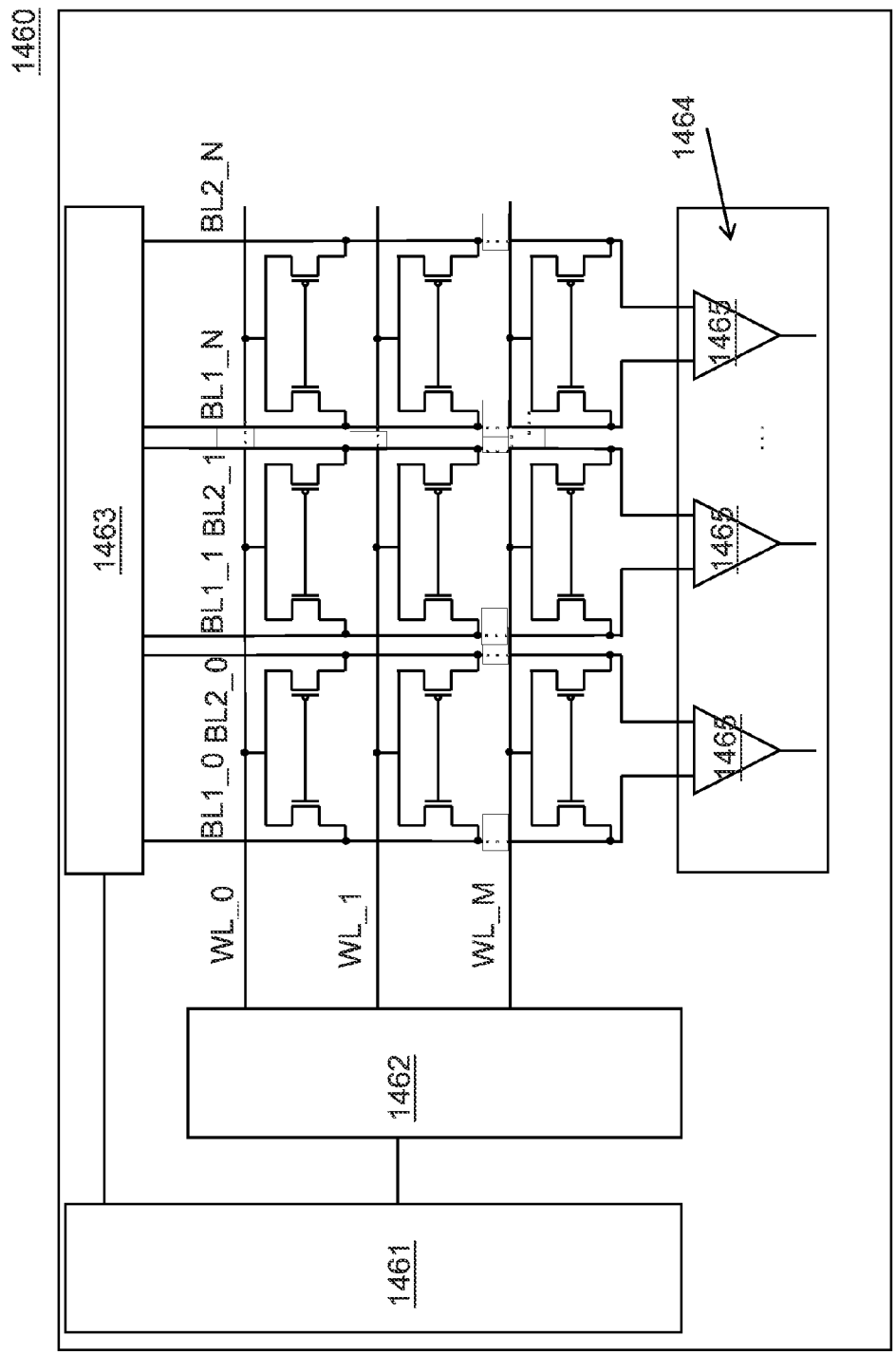
FIG. 15 is a diagram of the non-volatile memory of FIG. 14.

An integrated circuit die 1400 using the memory cell 10 is shown in FIG. 14. The integrated circuit die 1400 in general may include at least one of logic circuits 1410, analog circuits 1420, one or more processors 1430, one or more controllers 1440, and volatile memory 1450. Examples of logic circuits 1410 include logic gates, multiplexers, registers, counters, timers, baseband decoders, digital filters, and the like. The analog circuits 1420 may include amplifiers, filters, mixers, power amplifiers, phase-locked loops, frequency synthesizers, receiver front ends, sensors, and the like. The volatile memory circuits 1450 may include dynamic random access memory (DRAM), static random access memory (SRAM), and the like. The non-volatile memory 1460, shown in detail in FIG. 15, comprises a plurality of memory cells identical to the memory cell 10, such as the memory array 50 shown in FIG. 5. The non-volatile memory 1460 may further comprise addressing logic 1461, word line drivers 1462 for providing the word line voltage VWL to the word line 160, bit line drivers 1463 for providing the first and second bit line voltages VBL1, VBL2 to the first and second bit lines 130, 140, and read-out circuitry 1464 including sense circuits 1465 for detecting the differential current of the first and second bit lines 130, 140. The sense circuits 1465 include operational amplifiers, for example.

Embodiments may achieve advantages. The memory cell 10 is logic-compatible, meaning that no extra process steps are required to integrate the memory cell 10 in normal logic semiconductor manufacturing processes. The memory cell 10 is also multi-time programmable (MTP). Differential read is possible with the memory cell 10, which increases read margin, and also makes the memory cell 10 scalable to 50 Angstrom gate oxide. The memory cell 10 only uses two transistors, which makes it an effective solution for applications requiring low area.

In accordance with various embodiments of the present disclosure, a non-volatile memory cell comprises an N-channel transistor having a drain terminal electrically connected to a word line, and a source terminal electrically connected to a first bit line, and a P-channel transistor having a source terminal electrically connected to the word line, and a drain terminal electrically connected to a second bit line. Gate terminals of the N-channel transistor and the P-channel transistor are electrically connected and floating.

A method of programming a memory device is provided in accordance with various embodiments of the present disclosure. The method comprises applying a first voltage to a drain terminal of an N-channel transistor and a source terminal of a P-channel transistor sharing a floating gate with the N-channel transistor, and applying a second voltage to at least one of a source terminal of the N-channel transistor, a drain terminal of the P-channel transistor, and a well terminal of the P-channel transistor. The first voltage is higher than the second voltage by a channel hot injection programming threshold.

A method of reading a memory device is provided in accordance with various embodiments of the present disclosure. The method comprises applying a read voltage to a drain terminal of an N-channel transistor and a source terminal of a P-channel transistor sharing a floating gate with the N-channel transistor, and sensing at least one of a first output current at a source terminal of the N-channel transistor and a second output current at a drain terminal of the P-channel transistor.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. As but one example, even lower programming voltages than those described herein are within the contemplated scope of the present invention, particularly as processing technology evolves to allow for smaller critical dimensions and thin film thicknesses. Accordingly, the appended claims are intended to include within their scope such processes, machines, manufacture, compositions of matter, means, methods, or steps.

What is claimed is:

1. A memory device comprising:
    an N-channel transistor having a drain terminal electrically connected to a word line, and a source terminal electrically connected to a first bit line; and
    a P-channel transistor having a source terminal electrically connected to the word line, and a drain terminal electrically connected to a second bit line;
    wherein gate terminals of the N-channel transistor and the P-channel transistor are electrically connected and floating.

2. The memory device of claim 1, wherein the gate terminals of the N-channel transistor and the P-channel transistor are a shared floating gate.

3. The memory device of claim 1, wherein the gate terminal of the N-channel transistor is electrically connected to the gate terminal of the P-channel transistor by a metal line.

4. The memory device of claim 1, wherein the N-channel transistor is formed in a P-well.

5. The memory device of claim 1, wherein the N-channel transistor is formed in a P-substrate.

6. The memory device of claim 1, wherein a gate oxide of the gate terminals has thickness less than about 75 Angstrom.

7. The memory device of claim 6, wherein the thickness is less than about 50 Angstrom.

8. A method of programming a memory device, the method comprising:
    applying a first voltage to a drain terminal of an N-channel transistor and a source terminal of a P-channel transistor sharing a floating gate with the N-channel transistor; and
    applying a second voltage to at least one of a source terminal of the N-channel transistor, a drain terminal of the P-channel transistor, and a well terminal of the P-channel transistor;
    wherein the first voltage is higher than the second voltage by a channel hot injection programming threshold.

9. The method of claim 8, wherein the applying the second voltage is grounding at least one of the source terminal of the N-channel transistor and the drain terminal of the P-channel transistor.

10. The method of claim 9, wherein the grounding is grounding the drain terminal of the P-channel transistor while the source terminal of the N-channel transistor is floating.

11. The method of claim 9, wherein the grounding is grounding the source terminal of the N-channel transistor and the drain terminal of the P-channel transistor.

12. The method of claim 8, wherein the channel hot injection programming threshold is in a range of about 4 to about 7 Volts.

13. The method of claim 12, wherein the channel hot injection programming threshold is in a range of about 5.5 Volts to about 6.5 Volts.

14. A method of reading a memory device, the method comprising:
- applying a read voltage to a drain terminal of an N-channel transistor and a source terminal of a P-channel transistor sharing a floating gate with the N-channel transistor; and
- sensing at least one of a first output current at a source terminal of the N-channel transistor and a second output current at a drain terminal of the P-channel transistor.

15. The method of claim 14, wherein the sensing is sensing a current differential between the first output current and the second output current.

16. The method of claim 14, wherein the sensing is sensing the first output current while floating the drain terminal of the P-channel transistor.

17. The method of claim 14, wherein the sensing is sensing the second output current while floating the source terminal of the N-channel transistor.

18. The method of claim 14, wherein the applying the read voltage is applying the read voltage in range of about 2 to about 5 Volts.

19. The method of claim 18, wherein the applying the read voltage is applying the read voltage in a range of about 2.2 Volts to about 2.8 Volts.

20. The method of claim 18, wherein the applying the read voltage is applying the read voltage in a range of about 3 Volts to about 3.5 Volts.

\* \* \* \* \*